United States Patent [19]

Mitchell et al.

[11] Patent Number: 5,218,168

[45] Date of Patent: Jun. 8, 1993

[54] LEADS OVER TAB

[75] Inventors: Steven L. Mitchell; Warren M. Farnworth, both of Boise, Id.

[73] Assignee: Micron Technology, Inc., Boise, Id.

[21] Appl. No.: 765,753

[22] Filed: Sep. 26, 1991

[51] Int. Cl.⁵ .......................................... H01L 23/02
[52] U.S. Cl. .................................. 174/52.4; 257/678
[58] Field of Search ................ 174/52.2, 52.4; 357/74; 437/209, 220, 225, 245; 361/390, 392, 393, 394, 395, 421; 257/678, 684, 690, 693, 694, 695, 734, 735, 736

[56] References Cited

U.S. PATENT DOCUMENTS

| | | |
|---|---|---|
| 3,617,817 | 11/1971 | Kawakatsu et al. ............... 174/52.4 |
| 5,012,323 | 4/1991 | Farnworth ............................ 357/75 |
| 5,025,114 | 6/1991 | Braden .............................. 174/52.4 |

Primary Examiner—Leo P. Picard
Assistant Examiner—Bot L. Ledynh
Attorney, Agent, or Firm—Wayne E. Duffy

[57] ABSTRACT

An improved system for the production of semiconductor devices is described. The invention incorporates conventional, known die attach technology and tape automated bonding technology with known technology for the selective placement of electroconductive material upon a polymer film, which is then enclosed in the same film, to create a system whereby typical integrated circuit die can be simultaneously attached, physically and electrically, to typical lead frames and lead fingers and other lead terminals, to produce a highly reliable integrated circuit, with low inductance between the die and the lead terminals, which may then be encapsulated and trimmed and formed, in known ways, to complete the assembled package.

2 Claims, 7 Drawing Sheets

LEADS OVER TAB

BACKGROUND OF THE INVENTION

1. Field of the Invention

The present invention relates to a means for providing electrical contact between the die circuits and the lead terminals in the assembly of an integrated microcircuit package.

2. Description of Prior Art

The physical attaching of die to a lead frame or other substrate and electrical connection of the microcircuits of that die to the lead fingers of the lead frame or to other terminals is commonly done in the semiconductor and microcircuit industries by using physically separate, complex and automated machine systems for the die attaching step and the lead wire bonding step in the assembly of a semiconductor package.

Present manufacturing technology accomplishes die attach in a number of different ways which include, but are not limited to:

1. Epoxy film—An epoxy film is dispensed on a lead frame area and the die is pressed on the film surface in a controlled manner to accomplish bonding. This process requires follow-on cure in a separate cure oven.

2. Epoxy film on tape—an epoxy film that is applied to both sides of a supporting tape is dispensed on a lead frame area. The die is pressed on the film in a controlled manner and follow-on cure is done in a separate oven.

3. Thermoplastic film—a film with thermoplastic adhesive on both sides of the film is attached to the lead frame. The frame with the film attached is presented below or above the die and the die is attached, using controlled pressure and temperature. No follow-on cure is required.

4. Thermoplastic tape—a piece of thermoplastic material is attached and bonded as in the thermoplastic film method.

The procedure by which electrical connection is made between the microcircuits of the die and the lead fingers of the lead frame or other terminals usually consists of using fine wires of known composition, which are bonded in known ways on their opposing ends to the die and lead fingers or terminals by means of a separate, complex, automated wire bonding machine, which operates in a known manner.

A relevant and now common method known as area wire bond (A-wire), developed by William C. Ward, et al., of IBM (U.S. Pat. No. 4,862,842) and described in the IEEE Journal, March, 1988, pp 552–557, uses first a highly automated die attach machine which is followed by a highly automated wire bonding machine. First the die attach machine lays down, on the central area of the lead frame, a thermoset film, which has a heat activated adhesive on each side. A die is then bonded to the film in a way which allows wires to be attached to bond pads on the die which are exposed by "via" holes in the film. The part is then moved to an oven for tape cure. After the tape cure, the lead frames are moved to the automated wire bonding machine, where fine wires are attached which connect the microcircuits on the die to the individual lead fingers on the frame, as shown in FIGS. 1 and 2.

The invention to be described herein eliminates the wire bond step and associated machinery and accomplishes the die attach and electrical connection steps on conventional die attach machinery by utilizing selective, pre-assembled combinations of polymer film substrates, envelopes, adhesives and electrically conductive strips and contact surfaces for connecting the individual lead fingers or other terminals to the individual die circuits. The application of this system to different integrated circuit (IC) technologies will be discussed in the preferred embodiments.

SUMMARY OF THE INVENTION

The general purpose of the present invention, which will be described subsequently in greater detail, is to provide a new and improved system for the assembly of integrated circuits used in the microcircuit industry, which will have all the advantages of prior art and none of the disadvantages. It is a further intent to simplify the manufacturing steps, improve product integrity and reduce production costs.

In this invention a polyimide film, such as Kapton (TM), is used as a substrate for the adhesive that binds the die to the lead frame or other support, when necessary. This film also serves as the substrate to hold a designated and preselected pattern of electrically conductive material, usually in thin, flat, parallel strips, which will electrically connect the individual lead fingers or other terminals to the individual die connections. The electroconductive material may be placed on one side of the film strip by known means such as, but not limited to methods commonly used in the manufacture of printed circuits or by known lithographic offset printing methods in which an electrically conductive ink is deposited in a preset pattern and dimension. The flat electroconductive strips are then covered by a second layer of Kapton (TM) in a known way to insulate them from other die or conductive surfaces. The second layer of polyimide film fuses with the first layer to form a uniform film of approximately 0.003" thickness, with the electroconductive strips embedded therein and insulated from external surfaces except where "via" holes in the tape permit electrical contact with the die and lead fingers by means of the raised beads or pins attached to opposing ends of the conductive strips.

Another known means of making the tape is by the use of silicones, using a cold forming method and layering the film as before. The actual method of placement of the electrically conductive material may depend upon the chosen design and dimensional restrictions of the particular integrated circuit to be manufactured.

Since, in this invention, an adhesive layer is applied on one side of the film to attach to the die and applied on the other side of the film to attach to the lead fingers or other terminals, it is essential that the opposing ends of the conductive strips on the film be raised enough above the parallel planes of the respective adhesive layers to make good electrical contact with the respective die connections and lead fingers or other terminals on each end.

One known technique for raising the point of contact upon the end of the conductive strip is by application of a suitable solder material. This is done after the initial preparation and insulation of the thin, flat, conductive strip. The polyimide film envelope and the adhesive layers will have "via" holes on the opposing ends and sides of the conductive strips to allow a solder point or other connecting point to extend through the adhesive layer and achieve good electrical contact with the die or lead finger or other terminal, when the die attach step is being accomplished.

The formulation of the polyimide tape, the pattern and dimensional requirements of the conductive strips, with its specific points of electrical contact, and the placement of the "via" holes is all accomplished in a known fabrication process and is often provided by an outside supplier, such as Mesa, Koltron or 3M, prior to the commencement of the die attach operation.

When the tape has been formulated, it is often desirable to have a reference or fiducial point marked upon the tape. This reference point may then, when desired, be used with lasers or computer controlled TV cameras or by visual inspection, in combination with indexing holes which have been made on the edges of the tape to match the standard indexing holes which exist on the lead frames, for the controlled movement of the lead frames during the die attach operation.

When the die attach operation has been completed by the appropriate attachment of one side of the tape and electroconductive means to the die and die circuits, simultaneously the lead fingers or other terminals have also been connected on the other side of the tape and electroconductive means, to the specific designated circuits of the die, at the connecting points determined in the original design of the integrated circuit and the lead fingers or other terminals.

The simultaneous die attach operation and the die to lead finger or other terminal electrical connection eliminates the need for a separate wire bond operation and the necessary automated machinery therefore.

Because design and size limitations may require the electrical connection point on the die to be very small, in the 0.001"-0.004" diameter range, it is sometimes desirable to provide point contact on one end of the electroconductive strip which will meet that criterion. One method, shown in one of the preferred embodiments (FIG. 5B), provides a standard solder bead point of contact between the conductive strip and the lead finger or other terminal, on one end. The other end of the strip is connected to the die by means of a fine point (50-100 micron radius) on the end of a rivet type connector, which allows such circuit connection to be much closer than can be achieved easily and dependably by known wire bond techniques.

Of course, when die attach and die to conductive strip to lead finger or other terminal steps are accomplished simultaneously, the integrated circuit connections are completed. The standard, known procedures of plastic or other type encapsulation and trim and form steps, in proper sequence, then finish the integrated circuit assembly.

These, together with other objects of the invention and the various features of novelty are pointed out with particularity in the preferred embodiments and the claims of this disclosure.

For a better understanding of the invention reference should be made to the accompanying drawings and descriptive matter which illustrate preferred embodiments of the invention.

DESCRIPTION OF THE PREFERRED EMBODIMENTS

Figure 1:
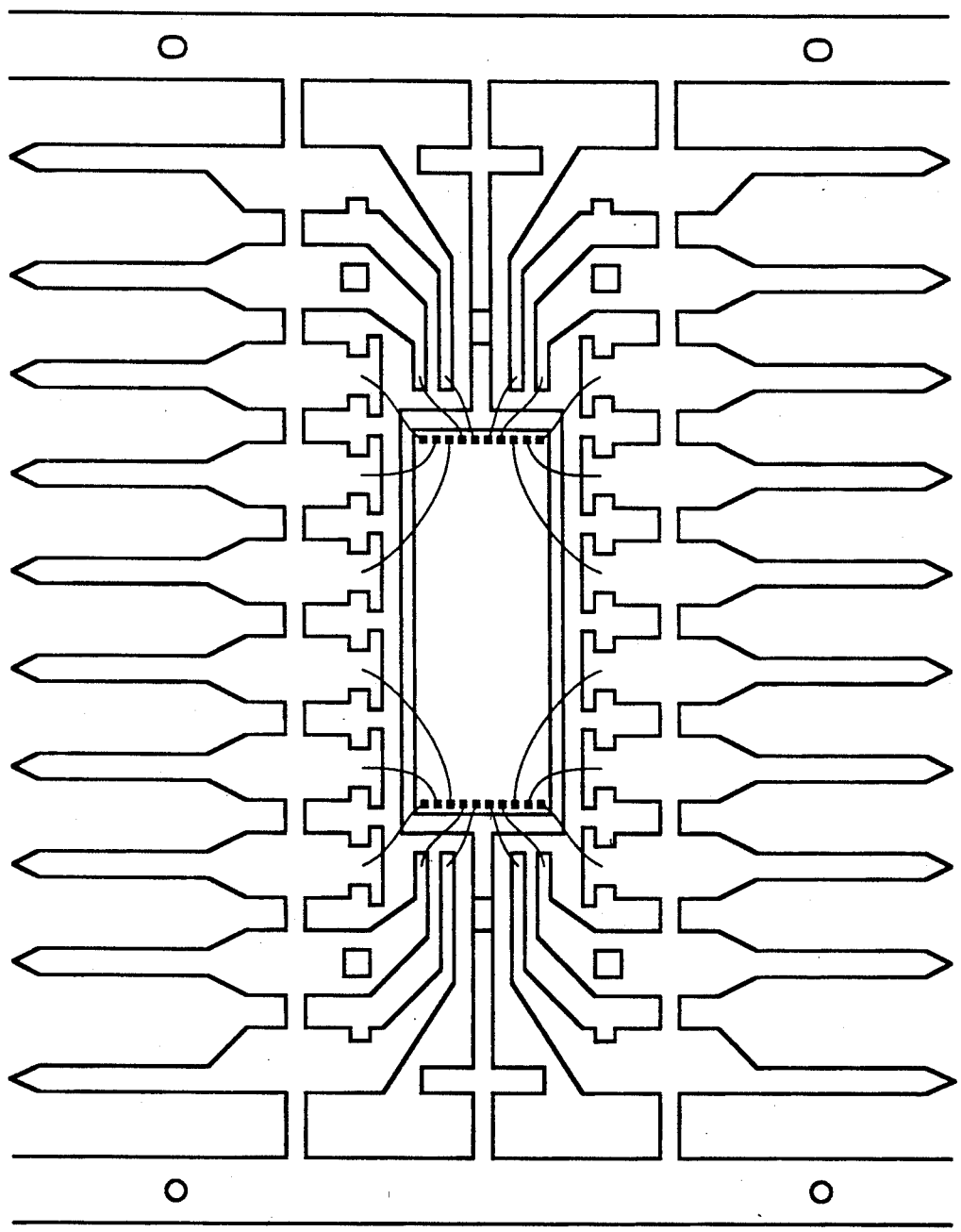
FIG. 1 is a top schematic view of prior art of a die with individual parallel end connections wire bonded to individual lead fingers.
Figure 2:
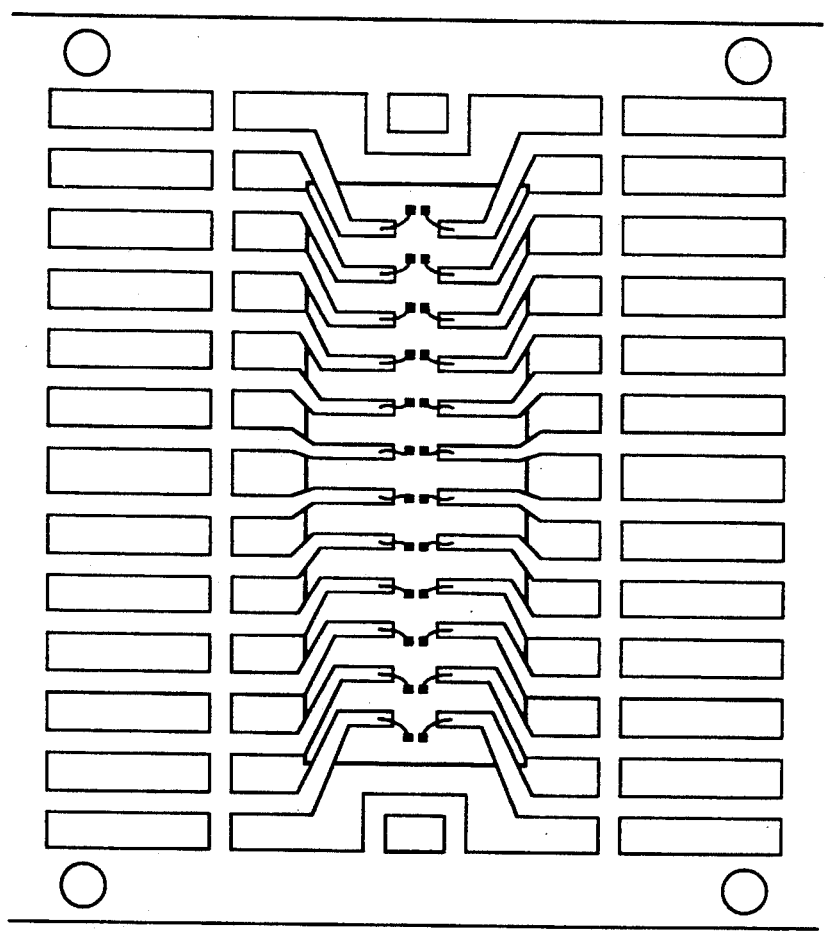
FIG. 2 is a top schematic view of prior art of a die with individual parallel central connections wire bonded to individual lead fingers.
Figure 3B:
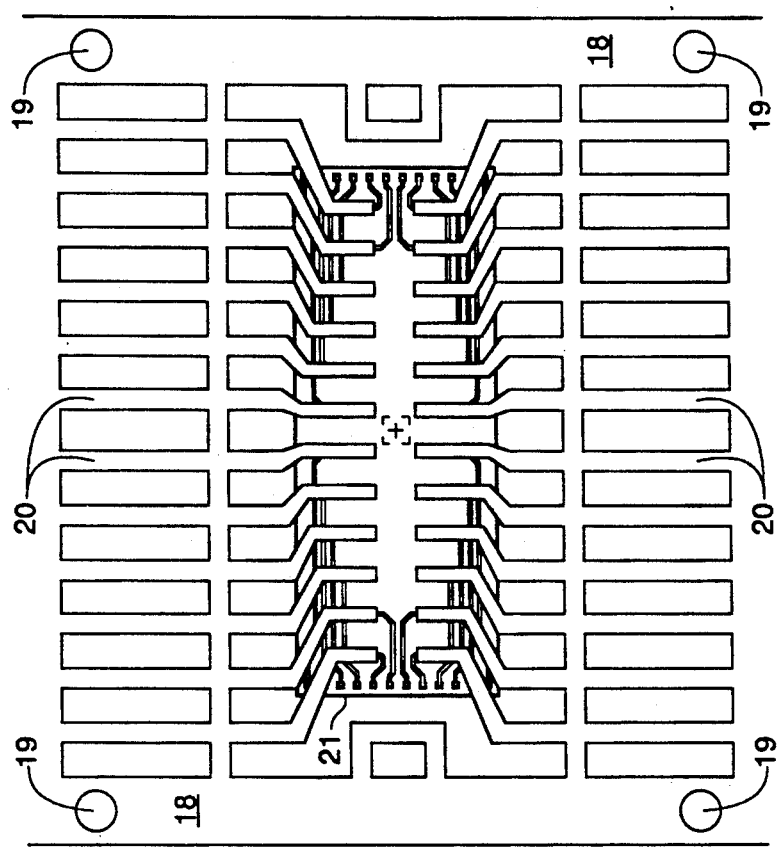
FIG. 3B is a top schematic view showing lead fingers overlaying the attached die and multiple electroconductive strips.
Figure 3A:
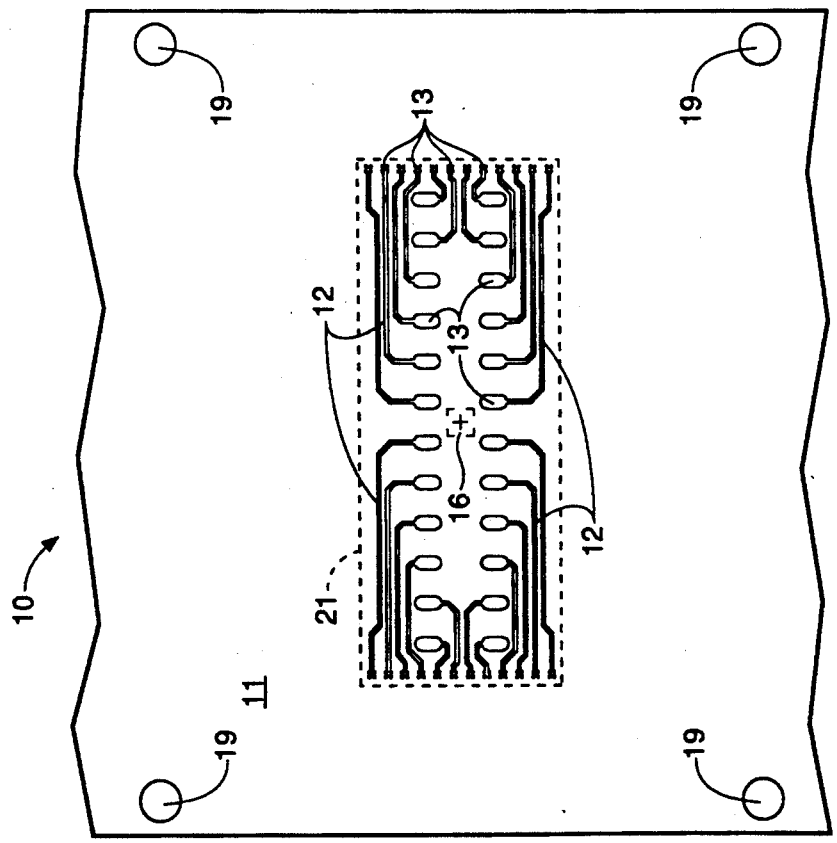
FIG. 3A is a top schematic view of polyimide film having characteristic pattern of flat, not shown, electroconductive strips impressed upon and integral to polyimide tape, with indexing holes for attachment to lead fingers in lead frame.

With reference now to the drawings and in particular to FIG. 3A thereof, a novel system of combining and integrating the die attach operation with the electrical connection of the die circuits to the lead fingers of the lead frame or other terminals used in the assembly of a semiconductor package will be described. The system embodies the principles and concepts of the present invention and is generally designated by the numeral 10.

In the first three of these preferred embodiments a known die attach machine, not shown, is utilized, in a way to be described. This is available as model ESEC 2005W or 2006 die attacher, manufactured by ESEC SA, Hinterbergstrasse 32, Cham, Switzerland. The last two embodiments use a flip chip die attacher, of known design, in a known way, which will be described briefly.

Referring again to FIG. 3A, a polyimide film substrate 11, such as Kapton( TM ), which has been chosen to conform to the dimensions of the lead frames which will be used in the integrated circuit assembly operation, is imprinted on one side with a plurality of electroconductive strips 12, by a known means. These strips are generally flat, with parallel upper and lower surfaces, not shown , laid out in a preselected pattern of generally parallel lines, which are physically and electrically separated from each other but fabricated to provide a reliable and uninterrupted flow of electrical current between predesignated points of selected die circuits and lead fingers, or other terminals, when the strips are connected as will be described.

The method of forming the electroconductive strips may be by known printed circuit technology or by known lithographic offset printing technology or other known technology and is usually provided, as requested, by outside suppliers such as Mesa, Koltron, and 3M.

After the electroconductive strips are imprinted or imposed, by known means, upon the polyimide film, a second layer of polyimide film 11 is placed on top of the first layer, in a known way, to cover the electroconductive strips 12 and insulate and isolate them from each other and any other unwanted electrical contact. The first and second layers of polyimide film 11 fuse together in a known way to form a moisture free, uniform film 11 which also serves as an alpha barrier for the enclosed circuitry. During the manufacture of the electroconductive strips upon the film, provision is made, in a known way, to be described, for electrical contact to extend upward through the film on one end of the strip and downward through the film on the opposing end of the strip. Thus one end of the strip will be able to have electrical contact with a die circuit and the other end will be able to have electrical contact with a lead finger, or other terminal, when the die attach process is carried out, as will be described.

This electrical contact is made, in one of the preferred embodiments, by placement, in a known way, of solder bead 13 of suitable dimension and length, on the upper surface of one end of the electroconductive strip and a second solder bead, of suitable dimension and length, on the lower, parallel surface of the electroconductive strip, on its opposing end.

The solder beads 13 or other electrical contact means to be described, on the opposing ends and sides of the electroconductive strips 12 are placed there, in a known way, to extend through openings in the polyimide film which are known as "via" holes 15 which circumferentially enclose the beads or other means and are located precisely and accurately, in a known way, during the preparation of the electroconductive strips and pattern of the connecting leads for the subsequent assembly of the integrated circuits. In some cases, this positioning of the "via" holes is aided by establishing a visible reference or fiducial point 16 on the surface of the film in a known way which may also be used as a reference point during the later die attach operation, in a known way.

Because of its method of formation, the solder bead contact means is usually limited to mating surfaces which are no smaller than approximately 0.004" in diameter. Most lead fingers or other terminals will equal or exceed this dimension at the point of electrical contact. However, the electrical contact area of some microcircuits on a die may be limited to 75 microns in diameter. This invention attempts to meet that condition by the design used in a second preferred embodiment and illustrated in FIG. 4 and FIG. 5B. In this version a solder bead type connector 13 is used between the electroconductive strip and lead finger or other terminal and a rivet type connector 14 is used on the opposing end and side of the strip which connects to the die and has a more limited space to make such connection. The rivet type connector is flattened in a known way on the end connected to the electroconductive strip and rounded in a known way on the end which connects to the die circuit. The rivet is usually made of a known electroconductive material which resists corrosion and oxidation but also may be formed from a non-resistive material such as copper which is coated in a known way on its conductive contact point by a conductive, corrosion resistant material such as a carbide, not shown. Such a rivet type design will present an electrical contact area in the 50–100 micron radius range and be quite suitable for a wide variety of microcircuit designs.

Figure 5A:
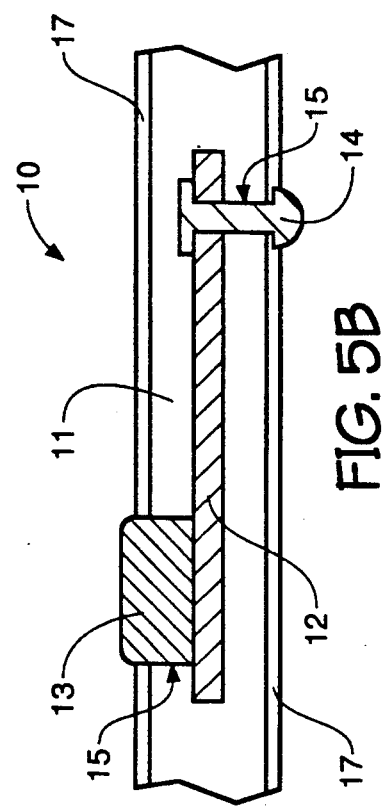
FIG. 5A is a side schematic view showing solder points of contact on opposing ends and sides of electroconductive strips.
Figure 5B:
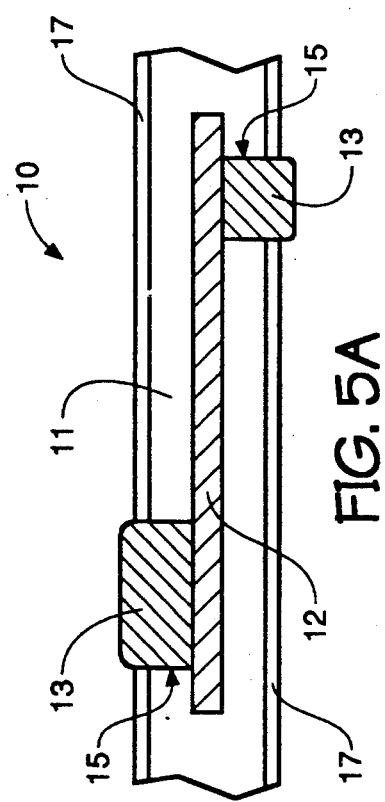
FIG. 5B is a side schematic view showing solder point contact on one end and side of strip and rivet type contact on other end and side of strip.
Figure 5C:
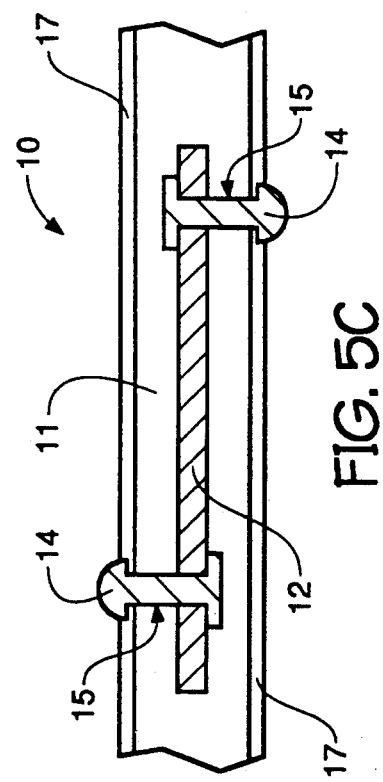
FIG. 5C is side schematic view showing rivet type point contacts on opposing ends and sides of electroconductive strip.

A third preferred embodiment, illustrated in FIG. 5C, shows a rivet type connector on each opposing end and each opposing side of the electroconductive strip, which allows the invention to be used in circuit designs where the electrical contact areas for the opposing ends of the conductive strip are extremely limited.

Of course, in all of the embodiments, an adhesive layer 17 is applied in a known way, to the upper and lower parallel surfaces of the polyimide film. These adhesive layers are usually applied in the form of thermoplastic tape and the upper and lower layers are each, individually designed to have "via" holes 15 precisely and accurately located, in a known way, to match the "via" holes 15 on each side of the polyimide film and circumferentially enclose the connectors on each end of the electroconductive strip while leaving the contact areas on the ends of the connectors open and free to establish good electrical contact with their respective die circuits and lead fingers.

When using any of the first three preferred embodiments upon the above mentioned ESEC die attachers or similar die attachers, a lead frame of known design, such as shown partially in FIG. 3B, and having opposing parallel side rails 18, with opposing indexing openings 19 precisely and accurately placed thereon and an array of opposing lead fingers 20 generally in parallel spaced relationship to each other, is mechanically or optically indexed precisely and accurately upon the work holder position, not shown, in a known manner, not shown, which engage the indexing openings on the lead frame and are a part of said work holder. Next, a section of the polyimide film which already contains the enclosed electroconductive strips and end connectors, in a predetermined pattern, and a thermoplastic adhesive layer 17 on both sides, is precisely attached on one side, to the lower side of the lead frame, by using indexing openings 19 which conform precisely and accurately with the indexing openings 19 on the lead frame. This film is indexed carefully in a known way, to position the electroconductive circuits and their end connectors to match exactly with the preselected die circuits and lead fingers of the integrated circuit being assembled. The adhesive layer is attached to the lead frame by using a thermode of known design, not shown, in a known manner to produce a controlled temperature, which causes a re-flow of the thermoplastic adhesive, thereby attaching the polyimide film to the lead frame.

The lead frame with the polyimide film and thermoplastic material attached is precisely and accurately indexed, in a known way, to a second work holder position, not shown. At this point a semiconductor device of known, preselected design, is then picked out of the array of the die that constitutes a wafer, not shown, and is placed precisely and accurately, in a known way, on the exposed thermoplastic material on the lower side of the film, so that the microcircuits on the die 21 will match exactly the appropriate electrical contact points on the ends of the electroconductive strips embedded in the polyimide film. The temperature of the thermode, not shown, at this position is higher than at the previous position, thereby causing significant softening of the thermoplastic material.

Figure 4:
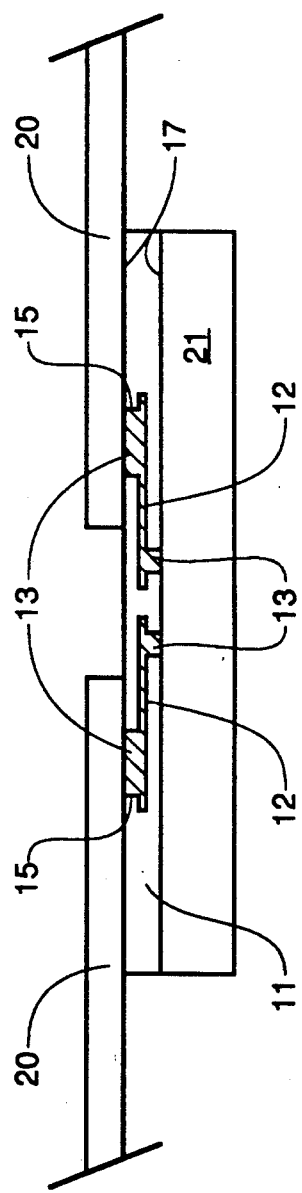
FIG. 4 is a side view schematically showing the attached die, lead fingers, electroconductive strip and enclosing film.

When appropriate to the process, the lead frame is again indexed to a third work holder position, not shown, for bonding, known as the post die attach lamination station. Another thermode, not shown, is used to securely laminate all of the elements together, as shown in FIG. 3B and FIG. 4, effectively creating a single, uniformly structured semiconductor package. The heat and mechanical force are controlled as before, but with a different known profile.

Next, typical, known plastic or other type encapsulation and trim and form steps are performed, in proper sequence, to complete the integrated circuit assembly.

Figure 6:
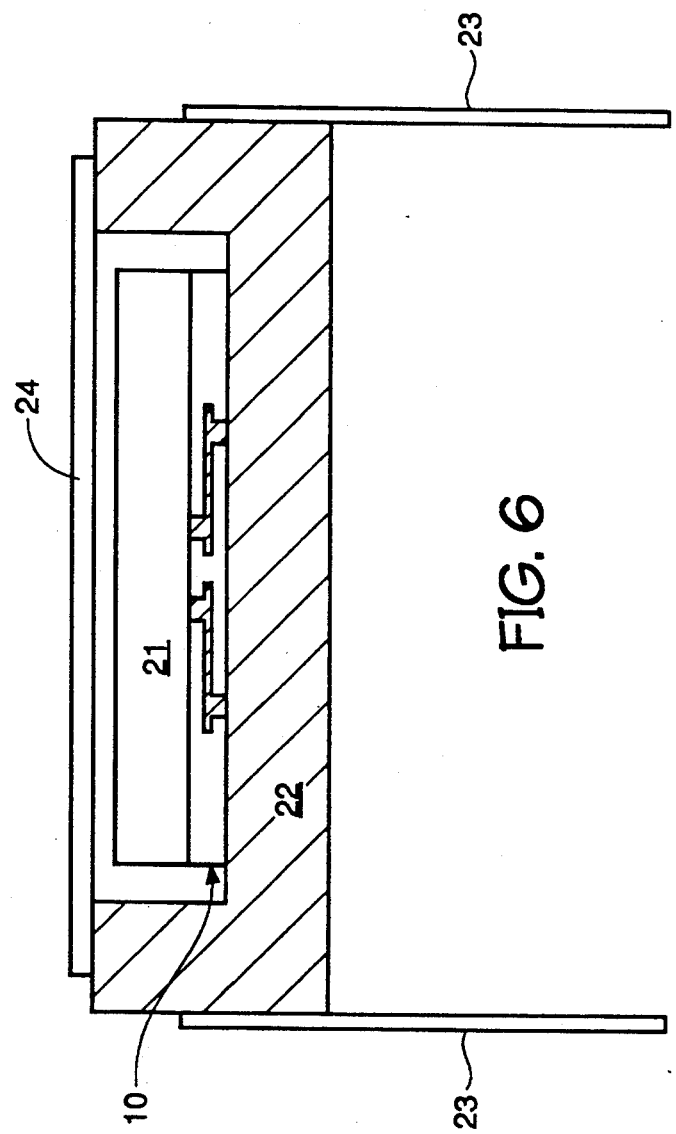
FIG. 6 is a side schematic view of a ceramic chip in a dual in line package (DIP) with the die connected to the circuits embedded in the ceramic, not shown.

Referring now to FIG. 6, which illustrates a fourth preferred embodiment, a ceramic chip 22, formed in a known manner, has two parallel rows of multiple electrical circuits embedded in the ceramic base in a known way, not shown, which extend on opposing ends, laterally outwardly from the central area, in opposing directions and generally parallel to the bottom surface of the ceramic and generally parallel to each other in the same horizontal plane, to make electrical contact, in a known way with multiple lead fingers 23, which are attached physically to the opposing, parallel sides of the ceramic chip and extend downward vertically in parallel spaced relationship to each other.

The opposing ends of the circuit embedded in the ceramic, not shown, extend in a known way, upward to the surface of the ceramic chip, in generally parallel spaced relationship, in the central area of the chip, to furnish multiple electrical contact points for the microcircuits of an attached die, not shown.

Using a known flip chip die attach machine, in a known way, the section of polyimide film containing the electroconductive means is excised precisely and accurately, in a known way and bonded appropriately to the ceramic surface to achieve proper physical and electrical contact between them. The flip chip portion of the machine then presents the bottom side of the die for attachment to the upper side of the polyimide film and the appropriate circuits of the die. After this assembly is completed an appropriately shaped lid 24, of known material and dimension is secured on top of the ceramic chip, in a known way, to enclose the attached die 21.

Figure 7:
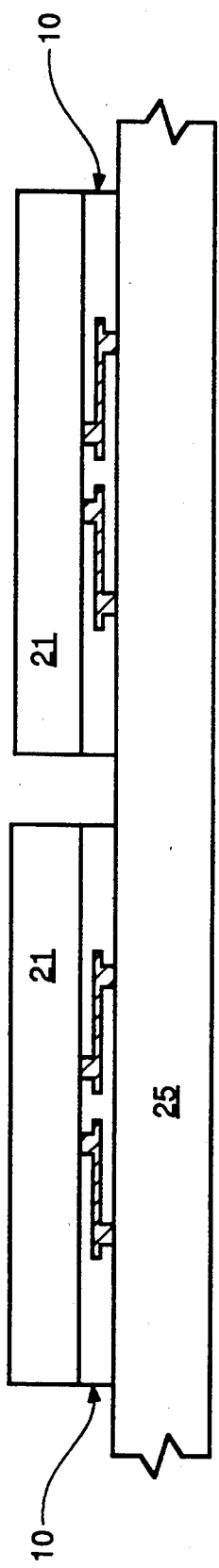
FIG. 7 is a side schematic view of a multichip module with die connected to the circuits therein, not shown.

Referring now to FIG. 7, which illustrates a fifth preferred embodiment, a die 21 of known design, with attached electroconductive means and polymer envelope is attached to a multi-chip module base 25 using a known flip chip die attacher, in a known way, to connect the multiple circuits in the die to the appropriate multiple leads in the multiple chip module. When this assembly is completed the integrated circuit usually is encapsulated in a known way, such as by placing a "glob" of plastic over each assembly to seal and insulate it from the environment and other assemblies.

The precise and accurate placement of the polyimide envelope containing the electroconductive means, upon the die and upon the ceramic chip or multichip module is usually aided by reference to a visible fiducial point 16 which has been placed on the polymer envelope.

A thermoplastic adhesive is utilized in these preferred embodiments but the attachment of the polyimide film substrate and envelope can be made using a thermoset adhesive and a separate cure oven, in a known manner. Using either adhesive method of die attach, the wire bond step is eliminated and an integrated circuit package having electrical connections with lower inductance between the die and the lead fingers or other terminals enclosed in the polyimide film envelope, exposed only on the connecting ends and protected from alpha radiation and moisture, and having high integrity, is produced, using tape automated bonding (TAB).

The present invention has been described fully in five preferred embodiments but many modifications and variations will be apparent to those skilled in the art. However, the scope of the invention is not limited by the above described details but only by the terms of the appended claims.

We claim:

1. A system for production of semiconductor devices which incorporates existing die attach technology and tape automated bonding technology with existing technology for the selective placement of electroconductive material upon a polymer film, to appropriately and simultaneously attach, physically and electrically, a semiconductor die to lead frames and lead fingers and other lead terminals to form an integrated circuit assembly suitable for encapsulation and trim and form operations, said system comprising:

a) a die attach means operable suitable for physical attachment of semiconductor die to lead terminals;

b) lead terminals operably and removably mountable upon said die attach means for the purpose of controllable and precise and accurate physical attachment thereto, of said die;

c) said semiconductor die having multiple microcircuits arranged therein to permit electrical connection to appropriate lead terminals;

d) a polymer film, serving first as a substrate for fixed attachment of multiple electroconductive means and second as an envelope to enclose said electroconductive means;

e) an array of electroconductive means with generally parallel upper and lower surfaces, having individual terminals on opposing ends and opposing surfaces, that are fixedly attached to and arranged in a pattern on said film substrate which matches on its opposing ends and surfaces, precisely and accurately, the appropriate opposing terminal points on the die and lead terminals to be connected;

f) said polymer film being further formulated to enclose, between its upper and lower parallel, planar surfaces, said electroconductive means;

g) said polymer film also having an adhesive layer adhesively attached to and covering both the upper and lower surfaces of said film;

h) said terminals on opposing ends and surfaces of said electroconductive means extending normally through both polyimide film and adhesive layers sufficiently to make electrical contact with respective die and lead terminals on opposing ends and surfaces of said means;

i) said lead terminals having means for indexing during operation of said die attach means in order to precisely and accurately control the physical position of said terminals in relation to said die and said polymer film envelope containing said enclosed electroconductive means;

j) said polymer film containing said electroconductive means also having means for indexing said film and said enclosed electroconductive means to control their physical position with relation to said die and said lead terminals, for the purpose of precisely and accurately and physically and electrically attaching said die and lead terminals thereto, by operation of said die attach means;

k) said die attach means serving first to hold and index said lead terminals and second to hold, index and adhesively attach said polyimide film and electrically attach said electroconductive means appropriately to said lead terminals;

l) said die attach means also serving third to hold, index and adhesively attach said die to said polymer film and fourth, to electrically and appropriately attach said die to said electroconductive means, thereby completing the physical positioning and electrical connecting of the die to the lead terminals, in preparation for subsequent, separate encapsulation and trim and form operations, performed in proper sequence on other equipment, to complete the assembly of the integrated circuit package.

2. An integrated circuit assembly system wherein semiconductor die, die attachment, polymer tape with electroconductive circuits deposited thereon and tape automated bond means are combined and integrated appropriately and simultaneously with lead frames and lead terminals to form an integrated circuit assembly suitable for encapsulation and trim and form operations, said system comprising:

a) a die attach means operably suitable for physical attachment of die to lead frames;

b) lead frames having lead fingers integral thereto, operably and removably mountable upon said die attach means, for the purpose of controllable and precise and accurate physical attachment thereto of die;

c) die having multiple microcircuits arranged therein to permit electrical connection to appropriate lead fingers of said lead frames;

d) a polymer film, serving first as a substrate for fixed attachment of multiple electroconductive means and second as an envelope to enclose said electroconductive means;

e) an array of electroconductive means, with generally parallel upper and lower surfaces, having individual terminals on opposing ends and opposing surfaces and fixedly attached to and arranged in a pattern on said film substrate, which matches on its opposing ends and surfaces, precisely and accurately, the appropriate opposing terminal points on the die and lead fingers to be connected;

f) said polymer film being further formulated to enclose, between its upper and lower parallel, planar surfaces, said electroconductive means;

g) said polymer film also having an adhesive layer, adhesively attached to and covering both the upper and lower surfaces of said film;

h) said terminals on opposing ends and surfaces of said electroconductive means extending normally through both polyimide film and adhesive layers sufficiently to make electrical contact with respective die and lead terminals on opposing ends of said means;

i) said lead frames having means of indexing said frames during operation of said die attach means in order to precisely and accurately control physical position of said frames and lead fingers in relation to said die and said polymer film envelope containing said enclosed electroconductive means;

j) said polymer film containing said electroconductive means also having means for indexing said film and said enclosed electroconductive means to control their physical position with relation to said die and said lead fingers, for the purpose of, precisely and accurately, physically and electrically attaching said die and lead fingers thereto, by operation of said die attach means;

k) said die attach means serving first to hold and index said lead frame and second, to hold, index and adhesively attach said polyimide film and electrically attach said electroconductive means appropriately to said lead fingers of said frame; and l) said die attach means also serving third, to hold, index and adhesively attach said die to said polymer film and fourth, to electrically and appropriately attach said die to said electroconductive means, thereby completing the positioning and electrical connection of the die to the lead fingers, in preparation for subsequent, separate, encapsulation and trim and form operation, performed in proper sequence on other equipment, complete the assembly of the integrated circuit package.

* * * * *